United States Patent [19]
Nakaya

[11] Patent Number: 6,130,553
[45] Date of Patent: Oct. 10, 2000

[54] PROGRAMMABLE FUNCTION BLOCK

[75] Inventor: Shogo Nakaya, Tokyo, Japan

[73] Assignees: NEC Corporation; Real World Computing Partnership, both of Tokyo, Japan

[21] Appl. No.: 09/169,948

[22] Filed: Oct. 13, 1998

[30] Foreign Application Priority Data

Oct. 15, 1997 [JP] Japan ..................................... 9-297883

[51] Int. Cl.⁷ ............................. G06F 7/38; H03K 19/177
[52] U.S. Cl. ............................... 326/39; 326/39; 326/37; 326/38; 326/41; 326/47
[58] Field of Search .................................. 326/37, 38, 39, 326/41, 47

[56] References Cited

U.S. PATENT DOCUMENTS 5,442,577   8/1995   Cohen ........................................ 364/716
5,570,039  10/1996   Oswald et al. ............................. 326/39
5,915,123   6/1999   Mirsky et al. ...................... 395/800.16

*Primary Examiner*—Michael Tokar
*Assistant Examiner*—Thanh-Tam Le
*Attorney, Agent, or Firm*—Foley & Lardner

[57] ABSTRACT

A programmable function block 20 comprises a logic block 21 including a full adder 31 and at least one preposition logic 32, and an input block 22 including programmable input switch units 40-1 through 40-9 for use in selectively switching a HIGH logic level signal, a LOW logic level signal, and a signal on interconnection lines 50. The preposition logic 32 comprises an exclusive OR circuit 32-1 and a multiplexer 32-2 and functions as various different logic circuits by means of setting some of the inputs thereof to a HIGH logic level or a LOW logic level. Thus, the logic block functions as various different logic circuits depending on the state of the inputs. In addition, the full adder provides fast arithmetic operation.

10 Claims, 22 Drawing Sheets

| INPUT | | | | EQUIVALENT LOGIC CIRCUIT |
|---|---|---|---|---|
| I0 | I1 | I2 | I3 | |
| I0 | | 0 | 0 | I0 —————o |
| I0 | | 0 | 1 | I0 —▷o— o |
| 0 | I1 | I2 | 0 | I2, I1 —AND— o |
| 0 | I1 | I2 | 1 | I2, I1 —NAND— o |
| 1 | I1 | I2 | 0 | I2, I1 —OR— o |
| 1 | I1 | I2 | 1 | I2, I1 —NOR-like— o |
| I0 | 1 | I2 | 0 | I2, I0 —OR— o |
| I0 | 1 | I2 | 1 | I2, I0 —NOR— o |
| I0 | 0 | I2 | 0 | I2, I0 —NAND— o |
| I0 | 0 | I2 | 1 | I2, I0 —XOR-like— o |
| I0 | | 0 | I3 | I3, I0 —OR— o |
| 1 | 0 | I2 | I3 | I3, I2 —XNOR— o |
| I0 | I1 | I2 | 0 | MUX(I2 sel; I1=1, I0=0) — o |
| I0 | I1 | I2 | 1 | MUX(I2 sel; I1=1, I0=0) —o (inverted) |

PROGRAMMABLE FUNCTION BLOCK

BACKGROUND OF THE INVENTION

The present invention relates to a programmable function block that is a logic unit for logic devices for implementing various functions with programs.

Logic devices such as PLDs or field programmable gate arrays (FPGAs) have been developed rapidly in recent years that can provide various functions with programs. By improvement in degree of integration and speed, it is expected to use the logic devices for reconfigurable computer systems with different hardware design depending on application programs used, not only for emulation in designing conventional application specific integrated circuits (ASICs) or as a mere alternative to simple peripheral circuits. In the conventional PLDs or FPGAs, a programmable function block comprises the circuit combined with multiplexers or comprises a look-up table (LUT) for implementing a plurality of functions. The programmable function block with the multiplexers or the look-up table provides lower performance in arithmetic operation that is frequently used in computers. On the other hand, arithmetic logic units (ALUs) based on a full adder, which are typically used for conventional general-purpose processors, provide good arithmetic operation performance but less functions as a logic circuit. Accordingly, the conventional ALUs are not suitable for the programmable function block in the PLDs or FPGAs.

SUMMARY OF THE INVENTION

An object of the present invention is to provide a high-speed programmable function block that can provide various logic functions, by means of combining a full adder suitable for fast arithmetic operation with a preposition logic performing plentiful logic functions.

In the present invention, a logic block includes a full adder to realize fast arithmetic operation. In addition, a preposition logic acting as various logic circuits is combined with the full adder to enhance and improve the variety of the logic functions, which otherwise cannot be achieved only with the full adder.

More specifically, the programmable function block according to the present invention comprises a logic block including a full adder with three input terminals and at least one preposition logic, and one or more programmable input switch unit for use in selectively switching a HIGH logic level signal, a LOW logic level signal, and a signal on interconnection lines that run throughout a semiconductor integrated circuit having at least one logic block mounted thereon and that available to connect between inputs and outputs of a plurality of circuits mounted on the semiconductor integrated circuit. The preposition logic comprises a first multiplexer that selects one of a first input and a second input depending on the value of a control input to produce the selected input, and an exclusive OR circuit for performing an exclusive OR operation on two inputs including the output from the first multiplexer. An output of the preposition logic is connected to one of the three input terminals of the full adder. Each output of the programmable input switch units is connected to each input of the logic block.

BRIEF DESCRIPTION OF THE DRAWINGS

FIG. 4 is a diagram for use in describing logic functions that can be implemented by the preposition logic in FIG. 2;

FIG. 7 is a diagram for use in describing logic functions that can be implemented by a full adder in FIG. 2;

FIG. 8 is a diagram showing an example of two-input two-output connection circuit to be implemented by using the full adder in FIG. 2;

DESCRIPTION OF THE PREFERRED EMBODIMENTS

Figure 1:
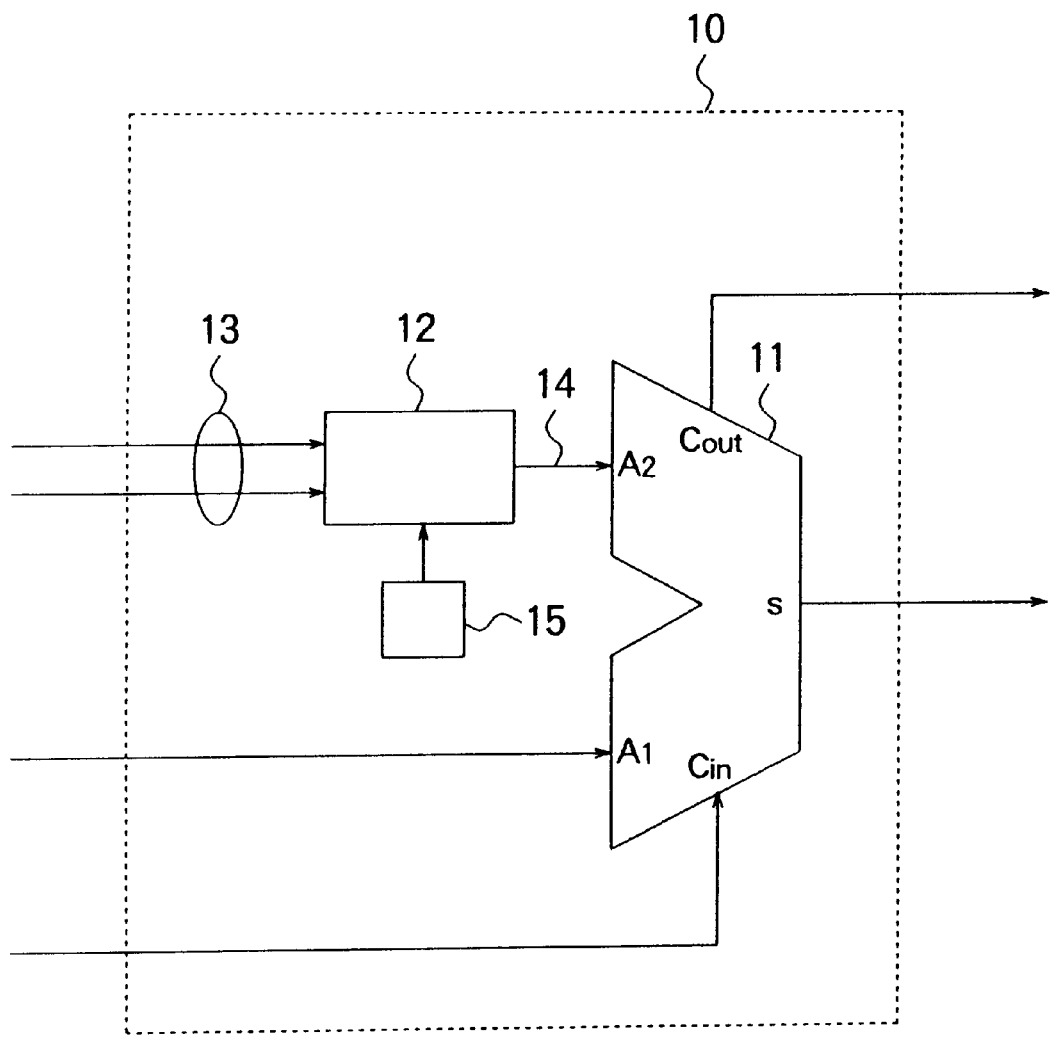
FIG. 1 is a diagram showing an example of a conventional logic block.

Referring to FIG. 1, an example of a logic block of a conventional field programmable gate array (FPGA) is described for the purpose of facilitating the understanding of the present invention. It is noted that the term "logic block" means a logic circuit unit in a programmable function block and is disclosed in, for example, U.S. Pat. No. 5,570,039. In this U.S. patent, the logic block is called a programmable function unit. A logic block 10 comprises a full adder 11 and a preposition logic 12. The full adder 11 has argument input terminals A1 and A2, a carry input terminal Cin, a summing output terminal S and a carry output terminal Cout. The argument input terminal A2 is connected to the preposition logic 12. The preposition logic 12 has two input lines 13 and one output line 14. The preposition logic 12 can implement two logic functions, that is, AND and EXNOR (negation of exclusive OR) depending on the content in a single bit memory 15. Accordingly, the logic block 10 can realize logic units for addition, subtraction, and multiplying operation.

However, this logic block 10 has insufficient functions because the preposition logic 12 has only two logic functions. In addition, a dedicated logic circuit for fast carry propagation and a look-up table are used in a practical FPGA in place of the full adder 11. This is because the full adder 11 is not enough from the viewpoint of the variety of the logic functions and is thus not suitable for the logic block in the PLDs or the FPGAs. However, the look-up table is not suitable for fast arithmetic operation (addition, subtraction, multiplying operation).

As apparent from the above, a problem of the conventional logic block is less functions implemented by the logic block. The preposition logic that provides less functions is a cause of this problem.

Figure 2:
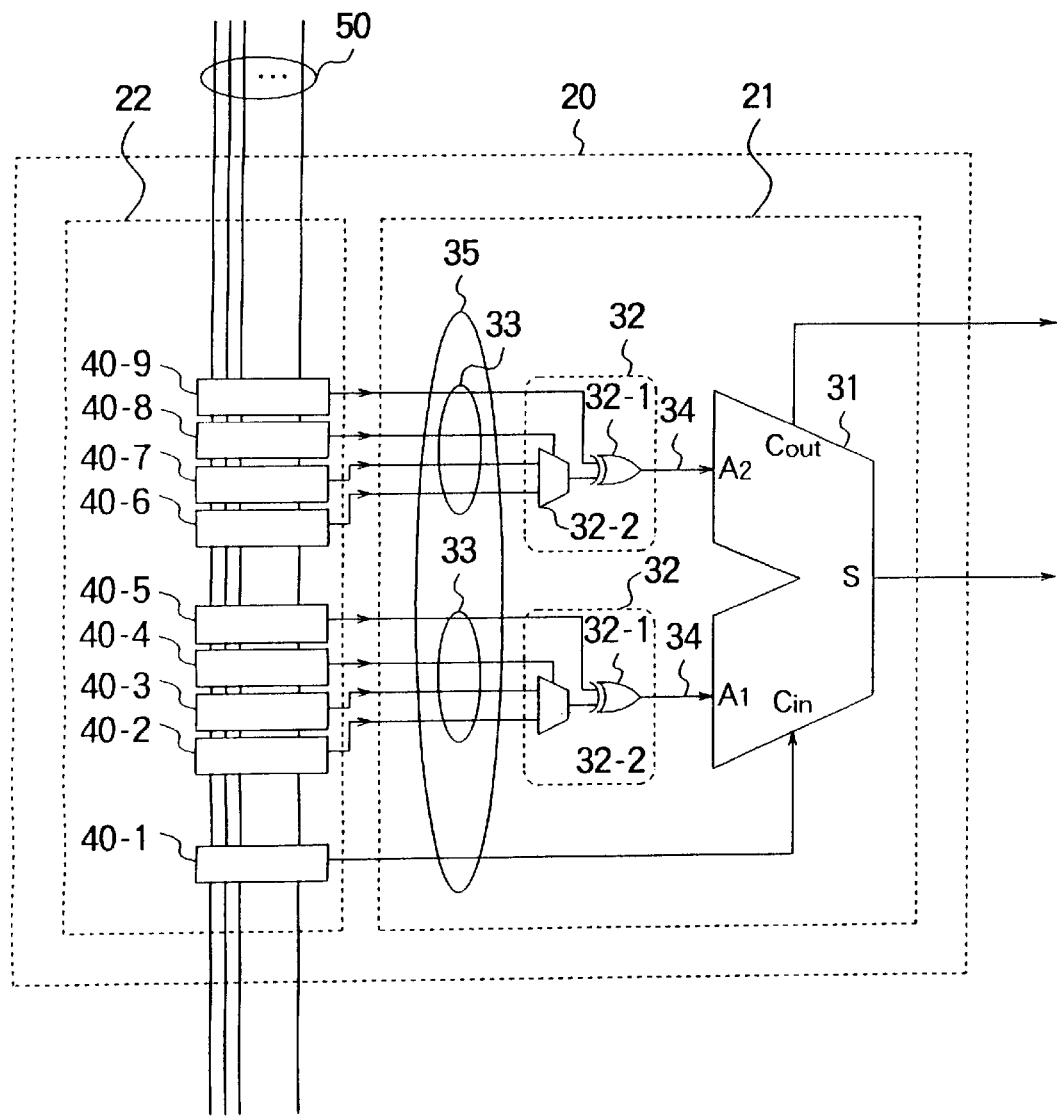
FIG. 2 is a block diagram of a programmable function block according to a first embodiment of the present invention.

Referring to FIG. 2, a programmable function block according to a first embodiment of the present invention is described. A programmable function block 20 comprises a logic block 21 and an input block 22. The logic block 21 comprises a single bit full adder 31 and two preposition logics 32.

The full adder 31 has argument input terminals A1 and A2, a carry input terminal Cin, a summing output terminal S, and a carry output terminal Cout. The preposition logic 32 comprises an exclusive OR circuit (hereinafter, referred to as EXOR) 32-1 that performs an exclusive OR operation on two inputs, and a multiplexer (hereinafter, referred to as MUX) 32-2 (first multiplexer) that is a circuit to produce one of the two inputs depending on the value of one control input. An output of the MUX 32-2 is connected to one input of the EXOR 32-1. The preposition logic 32 has four input lines 33 and one output line 34. The output line 34 is connected to the argument input terminals of the full adder 31. In general, at least one of the three input terminals A1, A2, and Cin is connected to the output line of the preposition logic 32. In this embodiment, two argument input terminals A1 and A2 are connected to the output lines 34 of two preposition logics 32, respectively.

The input block 22 comprises a plurality of input switch units 40-1 through 40-i (i is a positive integer and i=9 in this embodiment) each of which is called a programmable input switch unit. A group of input lines 35 of the logic block 21 comprises input lines 33 of the preposition logics 32 and an input line of the full adder 31 that is not connected to the preposition logics 32. Each of the input lines is connected to a group of interconnection lines 50 through the single input switch unit. The preposition logic 32 can functions as various logic circuits by means of setting one or more of four input lines 33 to 1 (HIGH logic level) or 0 (LOW logic level).

Figure 3:
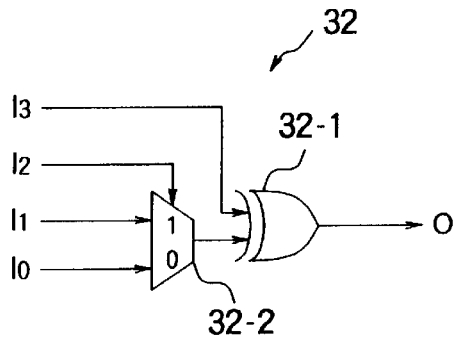
FIG. 3 is a diagram for use in describing configuration of a preposition logic and symbols imparted to inputs and outputs in FIG. 2.

Symbols are imparted to the inputs and the output of the preposition logic 32 as shown in FIG. 3. The values "1" and "0" on the MUX 32-2 have the following meaning. When a control input I2 of the MUX 32-2 is "1", then an input I1 is propagated to the output of the MUX 32-2. When the control input I2 is "0", then an input I0 is propagated to the output of the MUX 32-2.

FIG. 4 shows functions of the preposition logic 32 (equivalent logic circuits) with different input levels. In the "Input Settings" column in FIG. 4, a blank cell is "don't care". The term "don't care" means that the logic function is not affected by the logic level of "1" or "0". The column of the equivalent logic circuits in FIG. 4 includes all kinds of one-input one-output logic circuits and two-input one-output logic circuits. The preposition logic 32 in this embodiment can functions as any one of the one-input one-output logic circuits and the two-input one-output logic circuits. It is noted that FIG. 4 shows major functions of the preposition logic 32 in this embodiment, which are not all functions thereof.

Figure 5:
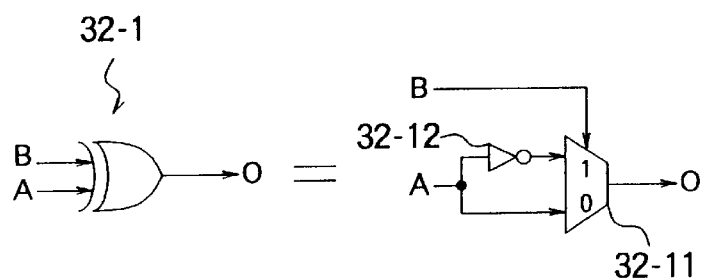
FIG. 5 is a diagram showing configuration of an exclusive OR circuit in FIG. 3.

The EXOR 32-1 of the pre position logic 32 comprises an MUX 32-11 (second multiplexer) and an inverter 32-12 as shown in FIG. 5.

Figure 6:
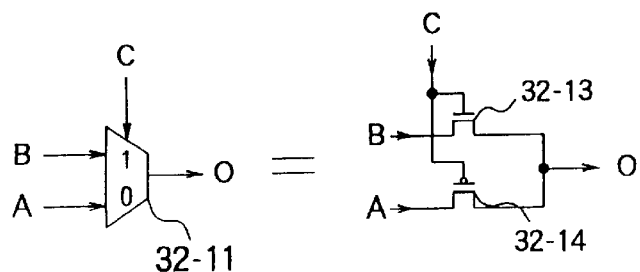
FIG. 6 is a diagram showing configuration of a multiplexer in FIG. 5.

The MUX 32-11 may be formed of one NMOS transistor 32-13 and one PMOS transistor 32-14 as shown in FIG. 6. The MUX 32-2 in FIG. 2 may be formed in a similar manner. As is well known in the art, an inverter 32-12 may be formed of one NMOS transistor and one PMOS transistor. Thus, the preposition logic 32 has only six transistors. This configuration allows the preposition logic according to this embodiment to be placed in a small area.

As described hereinunder, the full adder 31 in the logic block 21 in FIG. 2 also functions as various logic circuits to some extent.

Figures 7, 8:
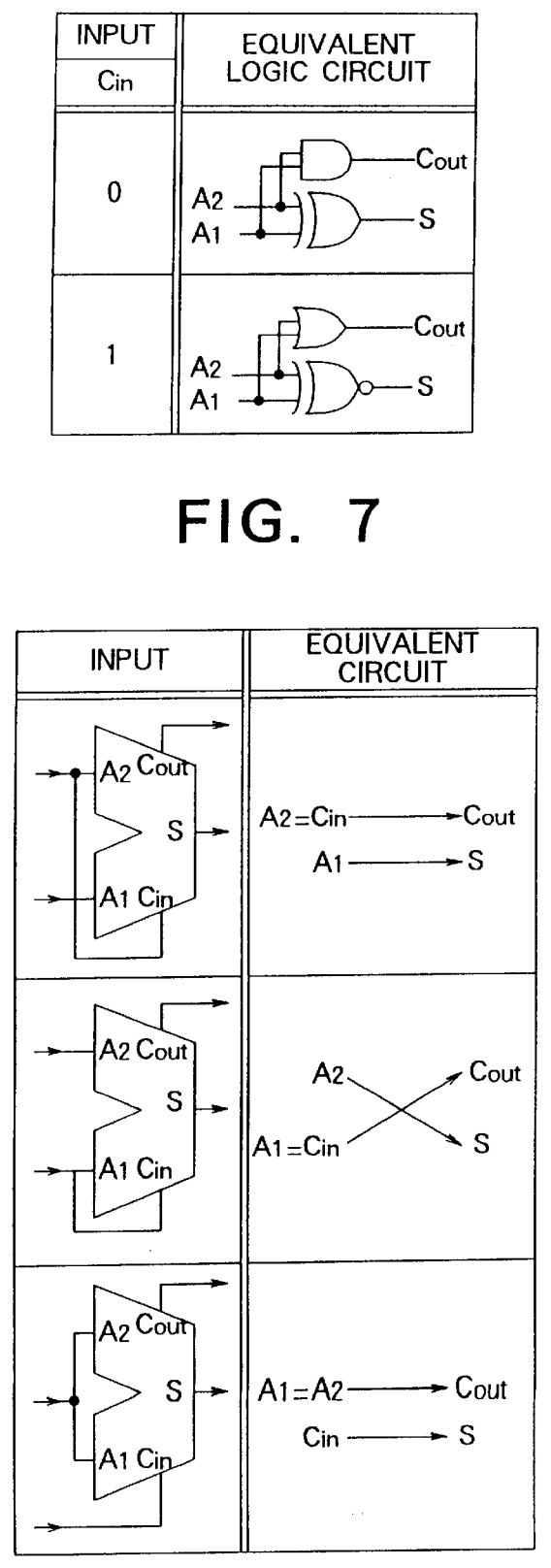

Referring to FIG. 7, the summing output terminal S and the carry output terminal Cout of the full adder 31 can function as the basic two-input one-output logic circuit, that is, EXOR, AND, EXNOR, and OR, by means of setting the logic "0" or "1" to the carry input terminal Cin of the full adder 31. The functions of the full adder 31 are invarient under the permutation of the inputs. Therefore, the carry input terminal Cin in FIG. 7 may be replaced by the argument input terminal A1 or A2.

Referring to FIG. 8, various two-input two-output connection circuits are realized by means of connecting two of the three input terminals A1, A2, and Cin of the full adder 31 as a common input terminal. This is useful for improving routability of the circuit using the programmable function block according to the present invention.

Figure 9:
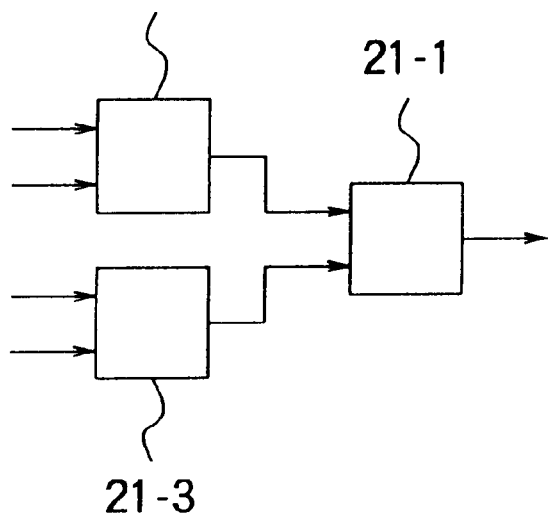
FIG. 9 is a diagram showing configuration of a four-input one-output logic function that can be implemented by a logic block according to the present invention.
Figure 10:
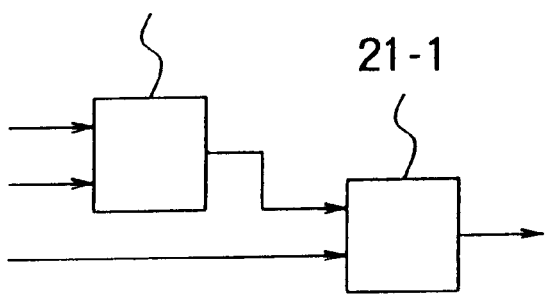
FIG. 10 is a diagram showing configuration of a three-input one-output logic function that can be implemented by a logic block according to the present invention.

The full adder 31 and the preposition logic 32 used in the present invention have the above-mentioned functions. Therefore, the logic block 21 utilizing the two preposition blocks 32 shown in FIG. 2 can realize certain four-input one-output logic circuits as shown in FIG. 9. In FIG. 9, reference numerals 21-1, 21-2, and 21-3 indicate certain two-input one-output logic circuits. Most significant four-input one-output logic circuits used in a practical circuit design can be configured with the circuit as shown in FIG. 9. In addition, the logic block 21 in FIG. 2 can also realize certain three-input one-output logic circuits having the configuration as shown in FIG. 10. The logic block 21 can further realize certain two-input one-output logic circuits and one-input one-output logic circuits. As described above, the logic block 21 in the present embodiment functions as various different logic circuits only by means of changing the setting of the input levels.

Next, the input switch unit is described that is used to set the input level. The input switch units 40-1 through 40-9 in FIG. 2 are for selectively switching a HIGH logic level signal, a LOW logic level signal, and a signal on interconnection lines 50.

Figure 11:
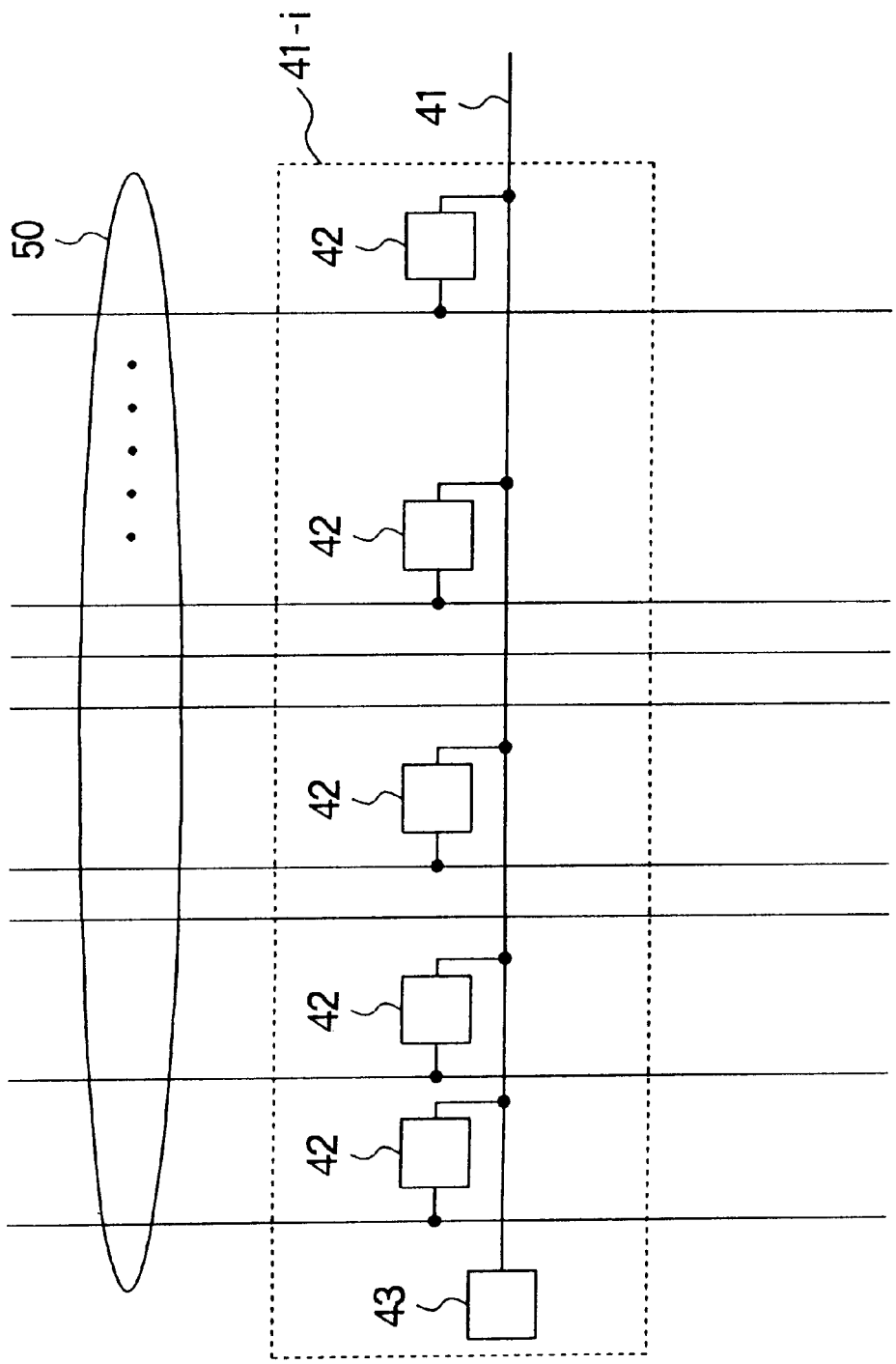
FIG. 11 is a circuit diagram showing a first example of an input switch unit in FIG. 2.

Referring to FIG. 11, a first example of the input switch unit 40-i is described. The input switch unit 40-i has one output line 41. The output line 41 is connected to one or more lines of the group of interconnection lines 50 through one or more programmable switches 42 and is connected to an output of a 0-1 switch 43. The programmable switch 42 is a circuit that can be set to connect or disconnect two terminals. The 0-1 switch 43 is a circuit having one output, of which output state can be set to any one of a HIGH logic level, a LOW logic level, or a high impedance state by using a program.

Figure 12:
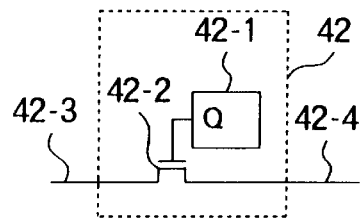
FIG. 12 is a circuit diagram showing a first example of a programmable switch in FIG. 11.

Referring to FIG. 12, a first example of the programmable switch 42 is described. The programmable switch 42 of the first example comprises a single-bit configuration memory 42-1 and an NMOS transistor 42-2. The content of the single-bit configuration memory 42-1 can be determined by using a program. An output Q of the configuration memory 42-1 is connected to the gate of the NMOS transistor 42-2. One terminal 42-3 of the programmable switch 42 is connected to or disconnected from another terminal 42-4 thereof depending on whether the output Q is "1" (HIGH logic level) or "0" (LOW logic level).

Figure 13:
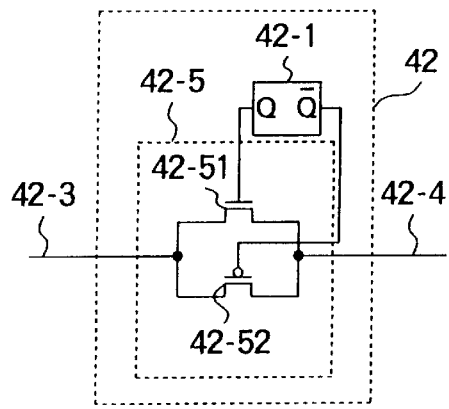
FIG. 13 is a circuit diagram showing a second example of the programmable switch in FIG. 11.

Referring to FIG. 13, a second example of the programmable switch 42 is described. The programmable switch 42 of the second example comprises the single-bit configuration memory 42-1 and a transmission gate 42-5. The content of the single-bit configuration memory 42-1 can be determined by using a program. The transmission gate 42-5 is formed of an NMOS transistor 42-51 and a PMOS transistor 42-52. The output Q̄ of the configuration memory 42-1 is connected to the gate of the NMOS transistor 42-51 and an inverted output Q of the configuration memory 42-1 is connected to the gate of the PMOS transistor 42-52. The one terminal 42-3 of the programmable switch 42 is connected to or disconnected from the other terminal 42-4 thereof depending on whether the output Q is "1" (HIGH logic level) or "0" (LOW logic level).

Figure 14:
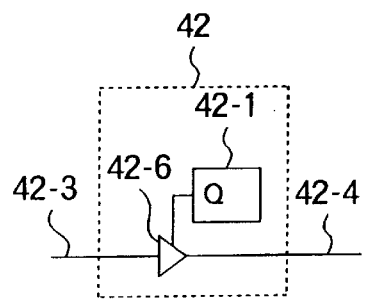
FIG. 14 is a circuit diagram showing a third example of the programmable switch in FIG. 11.

Referring to FIGS. 11 and 14, a third example of the programmable switch 42 is described. The programmable switch 42 of the third example comprises the single-bit configuration memory 42-1 with the output Q thereof connected to a control terminal of a tristate buffer 42-6. An input terminal 42-3 of the tristate buffer 42-6 is connected to one line of the group of interconnection lines 50. An output terminal 42-4 of the tristate buffer 42-6 is connected to the output line 41 of the input switch unit 40-i. The input terminal 42-3 of the programmable switch 42 is connected to or disconnected from an output terminal 424 thereof depending on whether the output Q of the configuration memory 42-1 is "1" (HIGH logic level) or "0" (LOW logic level). Other examples of the programmable switch 42 include fuse and anti-fuse.

Figure 15:
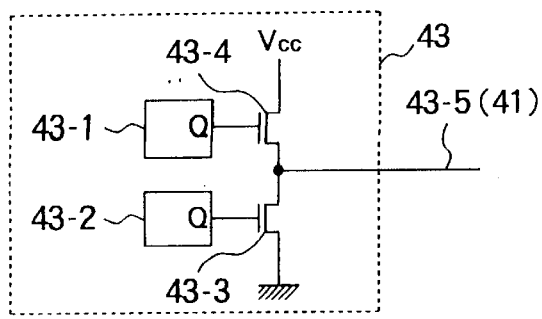
FIG. 15 is a circuit diagram showing an example of a 0-1 switch in FIG. 11.

Referring to FIG. 15, a preferable example of the 0-1 switch 43 is described. The 0-1 switch 43 comprises single-bit configuration memories 43-1 and 43-2, an NMOS transistor 43-3, and a PMOS transistor 43-4. The source of the NMOS transistor 43-3 is connected to a ground and the source of the PMOS transistor 43-4 is connected to a power supply Vcc. The drain of the NMOS transistor 43-3 is connected to the drain of the PMOS transistor 43-4 and a junction thereof is an output terminal 43-5. The output Q of the configuration memory 43-1 is connected to the gate of the PMOS transistor 43-4 while the output Q of the configuration memory 43-2 is connected to the gate of the NMOS transistor 43-3. The output terminal 43-5 is in the high impedance state when the output Q of the configuration memory 43-1 is "1" and the output Q of the configuration memory 43-2 is "0". The output terminal 43-5 is at the HIGH logic level when the output Q of the configuration memory 43-1 is "0" and the output Q of the configuration memory 43-2 is "0". The output terminal 43-5 is at the LOW logic level when the output Q of the configuration memory 43-1 is "1" and the output Q of the configuration memory 43-2 is "1".

Figure 16:
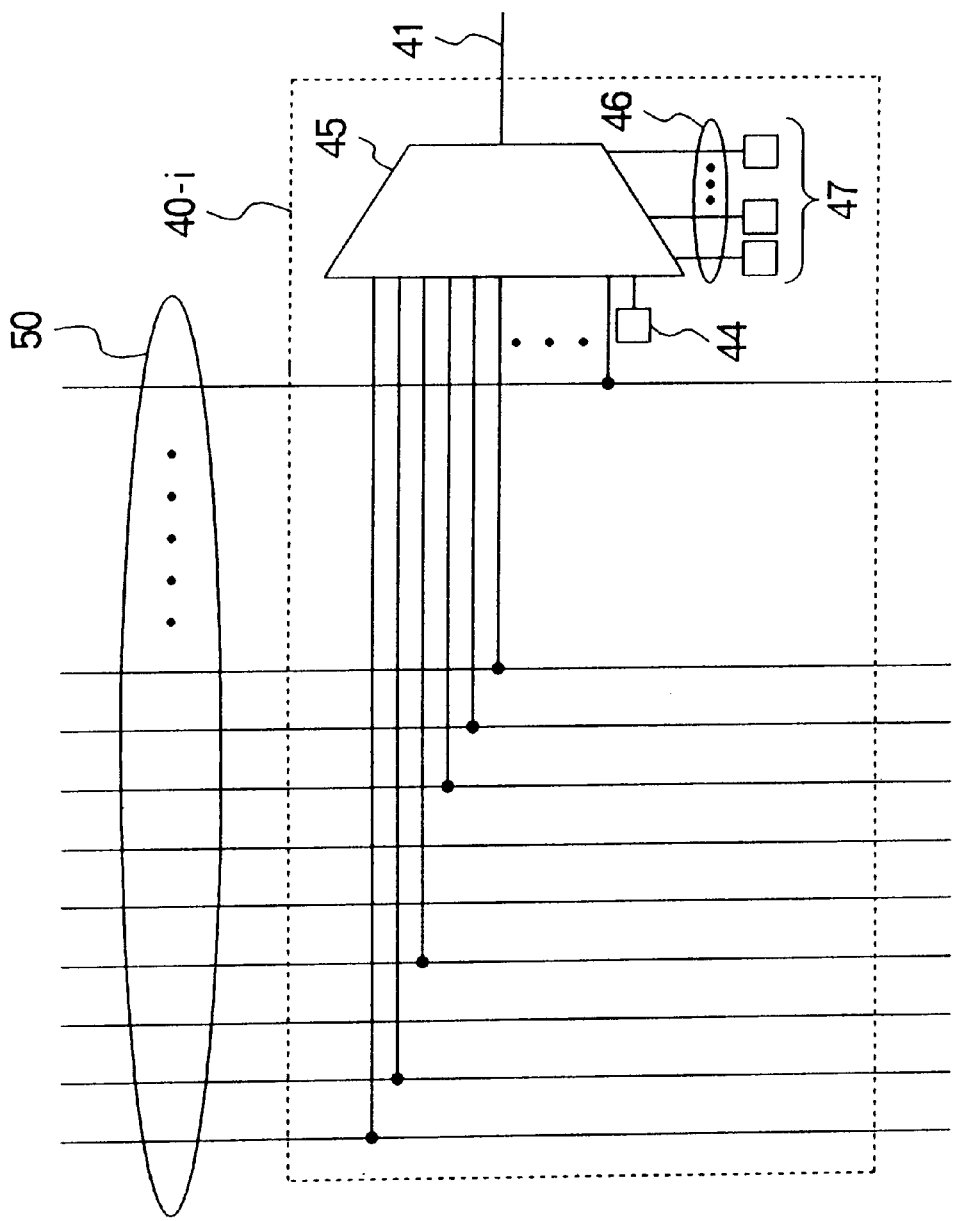
FIG. 16 is a circuit diagram showing a second example of the input switch unit in FIG. 2.

Referring to FIG. 16, a second example of the input switch unit 40-i is described. One or more lines of the group of interconnection lines 50 and an output of a single-bit configuration memory 44 are connected to the inputs of a multiplexer 45. Outputs of single-bit configuration memories 47 are connected to lines of a group of control input lines 46 of the multiplexer 45. One of the inputs of the multiplexer 45 is transferred to the output line 41 depending on the output of the configuration memory 47 that is set by using a program. The configuration memory 44 is for providing a HIGH logic level signal or a LOW logic level signal to one input of the multiplexer 45. The content of the configuration memory 44 is predetermined by using a program.

Figure 17:
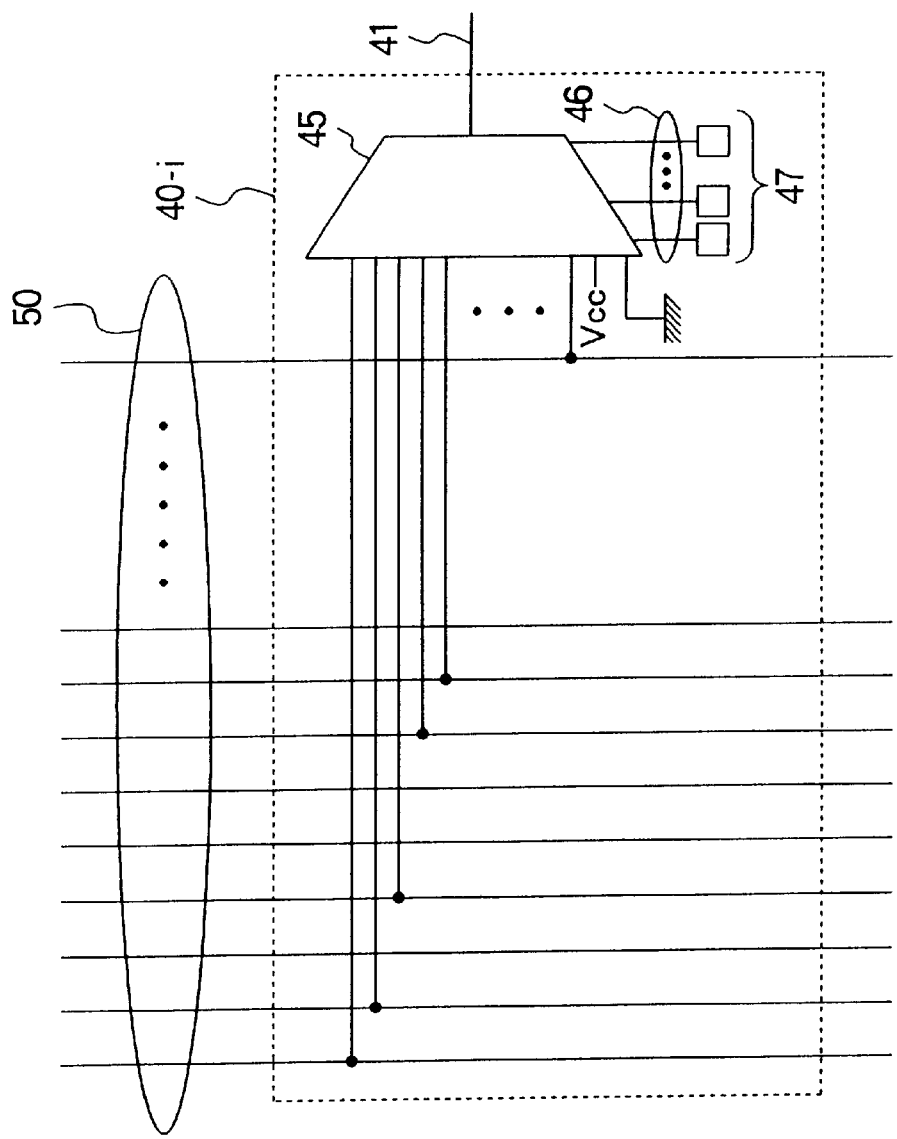
FIG. 17 is a circuit diagram showing a third example of the input switch unit in FIG. 2.

Referring to FIG. 17, a third example of the input switch unit 40-i is described. One or more lines of the group of interconnection lines 50, the power supply Vcc, and the ground are connected to the inputs of the multiplexer 45. Lines of the group of control input lines 46 of the multiplexer 45 are connected to outputs of the configuration memories 47. One of the inputs of the multiplexer 45 is transferred to the output line 41 depending on the content of the configuration memory 47 determined by using a program.

In FIG. 2, the line connected to the input switch unit out of the group of interconnection lines 50 depends on the input switch unit and is not necessarily the same for all input switch units.

Figure 18:
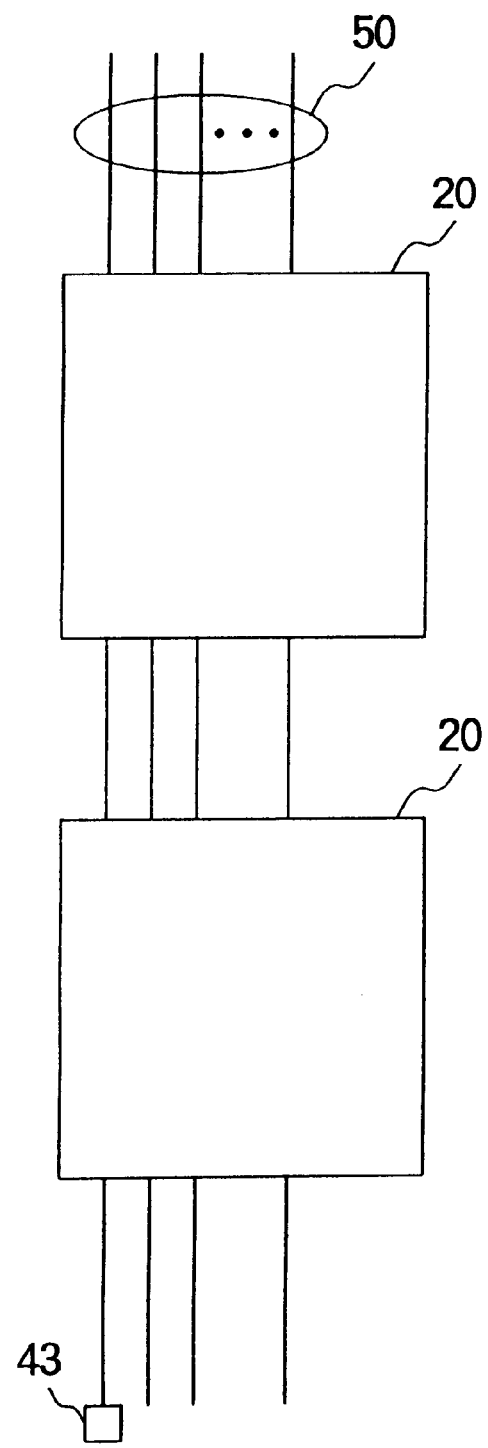
FIG. 18 is a diagram for use in describing an alternative way of providing a HIGH logic level signal and a LOW logic level signal.

Referring to FIG. 18, another way of providing a HIGH logic level signal and a LOW logic level signal is described. In this example, the input switch unit has no unit of supplying the HIGH logic level signal and the LOW logic level signal. For the case of the input switch unit in FIG. 11 for example, the 0-1 switch 43 is omitted. For the input switch unit in FIG. 16, the configuration memory 44 is omitted. For the input switch unit in FIG. 17, the power supply Vcc of the multiplexer 45 and the ground input are omitted. Instead, as shown in FIG. 18, the 0-1 switch 43 is connected to at least one line of the group of interconnection lines 50. The interconnection line connected to the 0-1 switch 43 is connected to the input switch units of one or more programmable function units 20. This example can provide the HIGH logic level signal and the LOG logic level signal by using less supply devices as compared with a case where the supply devices are provided individually in each input switch unit for the HIGH logic level signal and the LOW logic level signal. In addition, the interconnection line to which the 0-1 switch 43 is connected may be used for an ordinary interconnection line through which other signals flow, by means of setting the 0-1 switch 43 to the high impedance state, if necessary.

Figure 19:
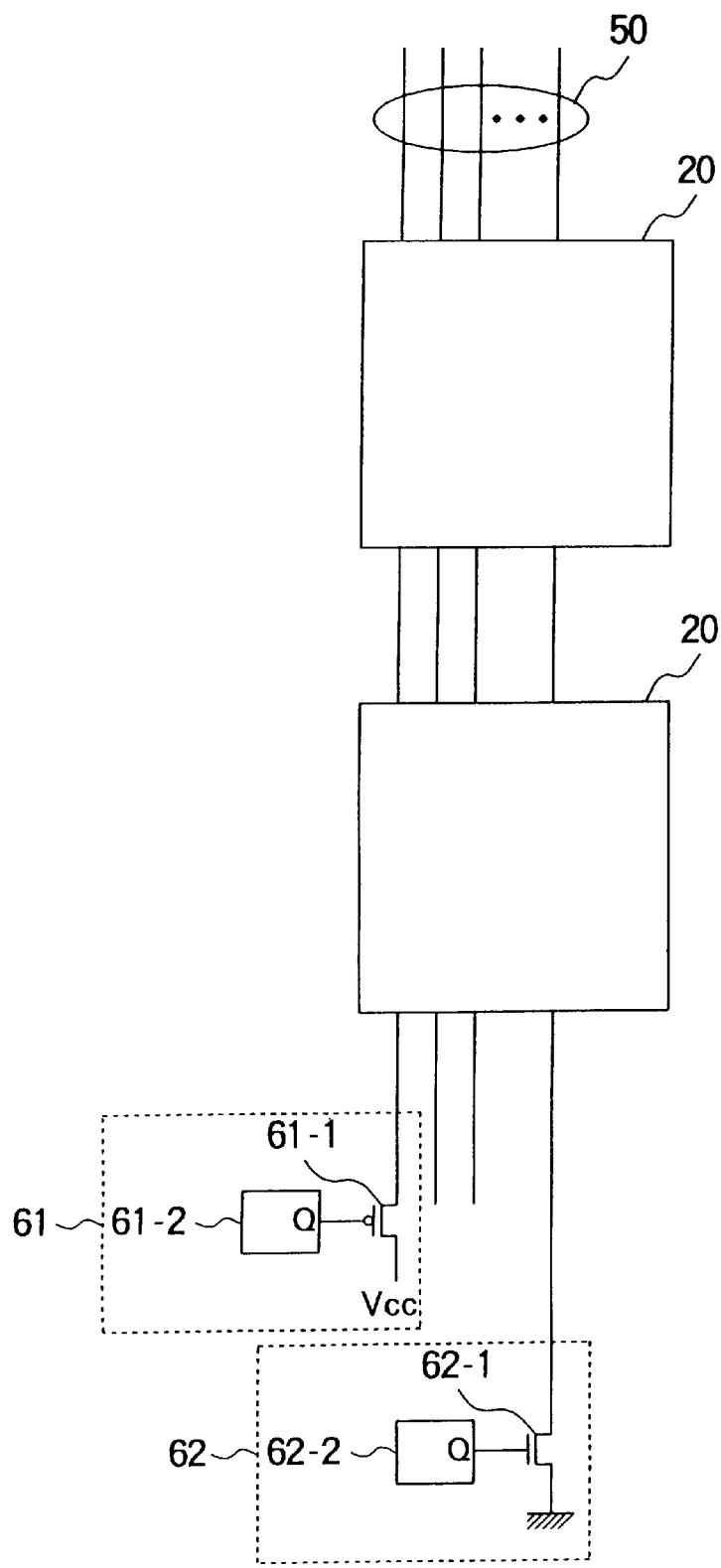
FIG. 19 is a diagram for use in describing yet another way of providing a HIGH logic level signal and a LOW logic level signal.

Referring to FIG. 19, yet another way of providing a HIGH logic level signal and a LOW logic level signal is described. In this example, at least one of the group of interconnection lines 50 is connected to a HIGH logic level signal switch 61 and at least one of the remaining interconnection lines is connected to a LOW logic level signal switch 62. The HIGH logic level signal switch 61 is formed with the source of a PMOS transistor 61-1 being connected to a power supply Vcc and the gate thereof being connected to an output Q of an single-bit configuration memory 61-2. In the HIGH logic level signal switch 61, a HIGH logic level signal is supplied to the interconnection line connected to the HIGH logic level signal switch 61 when the output Q of the configuration memory 61-1 is "0". When the output Q of the configuration memory 61-1 is "1", then the interconnection line connected to the HIGH logic level signal switch 61 is disconnected and insulated from the power supply Vcc. As a result, the interconnection line connected to the HIGH logic level signal switch 61 is available as an ordinary interconnection line through which other signals flow.

On the other hand, the LOW logic level signal switch 62 is formed with the source of an NMOS transistor 62-1 being grounded and the gate thereof being connected to an output Q of a single-bit configuration memory 62-2. In the LOW logic level signal switch 62, the LOW logic level signal is supplied to the interconnection line connected to the LOW logic level signal switch 62 when the content of the configuration memory 62-2 is "1". When the content of the configuration memory 62-2 is "0", then the interconnection line connected to the LOW logic level signal switch 62 is disconnected and insulated from the ground. As a result, the interconnection line connected to the low LOGIC level signal switch 62 is available as an ordinary interconnection line through which other signals flow.

Next, typical examples of a programmable function module and a programmable logic device are described which utilize the programmable function block according to the present invention.

Figure 20:
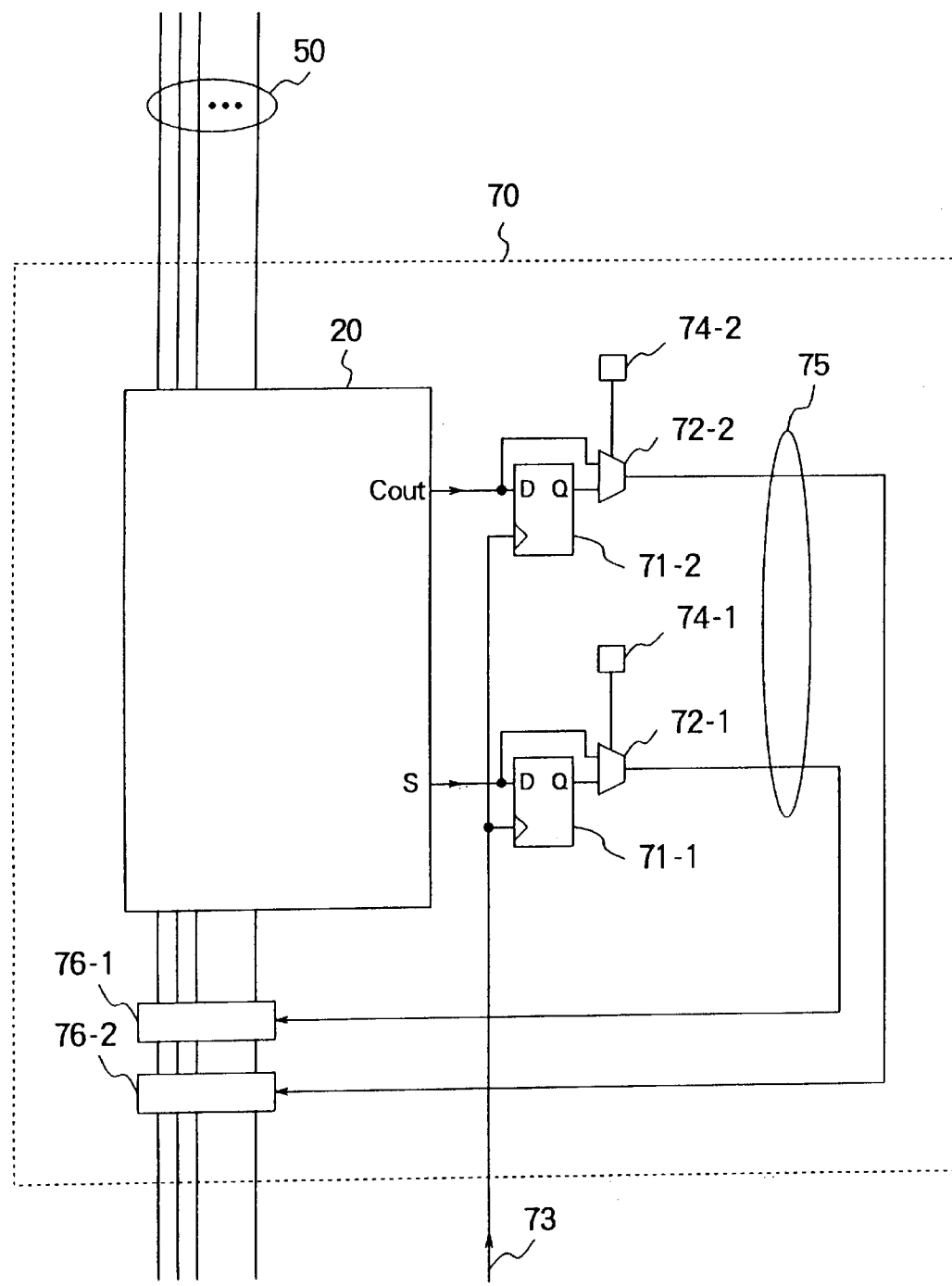
FIG. 20 is a diagram showing an example of a programmable function module to which the present invention is applied.

FIG. 20 shows a typical example of a programmable function module 70 that is a combination of the programmable function block 20 with an output unit to the interconnection line as well as registers. An output terminal S of the programmable function block 20 is connected to an input D of a first D-flip flop (hereinafter, referred to as D-FF) 71-1 and one of the inputs of a two-input one-output MUX 72-1. The other input of the first MUX 72-1 is connected to an output Q of the first D-FF 71-1. An output terminal Cout of the programmable function block 20 is connected to an input D of a second D-FF 71-2 and one of the inputs of a second two-input one-output MUX 72-2. The other input of the second MUX 72-2 is connected to an output Q of the second D-FF 71-2. The first and the second D-FF 71-1 and 71-2 are driven with a clock signal 73. A control input of the first MUX 72-1 is connected to an output of a single-bit configuration memory 74-1. The first MUX 72-1 produces the signal on the output terminal S of the programmable function block 20 as it is or produces it through the first D-FF 71-1, depending on the content of the configuration memory 74-1. This applies to the second MUX 72-2. More specifically, the second MUX 72-2 produces the signal on the output terminal Cout of the programmable function block 20 as it is or produces it through the second D-FF 71-2, depending on the content of a single-bit configuration memory 74-1. Outputs 75 of the first and the second MUX 72-1 and 72-2 are connected to the group of interconnection lines 50 through output units 76-1 and 76-2, respectively.

Figure 21:
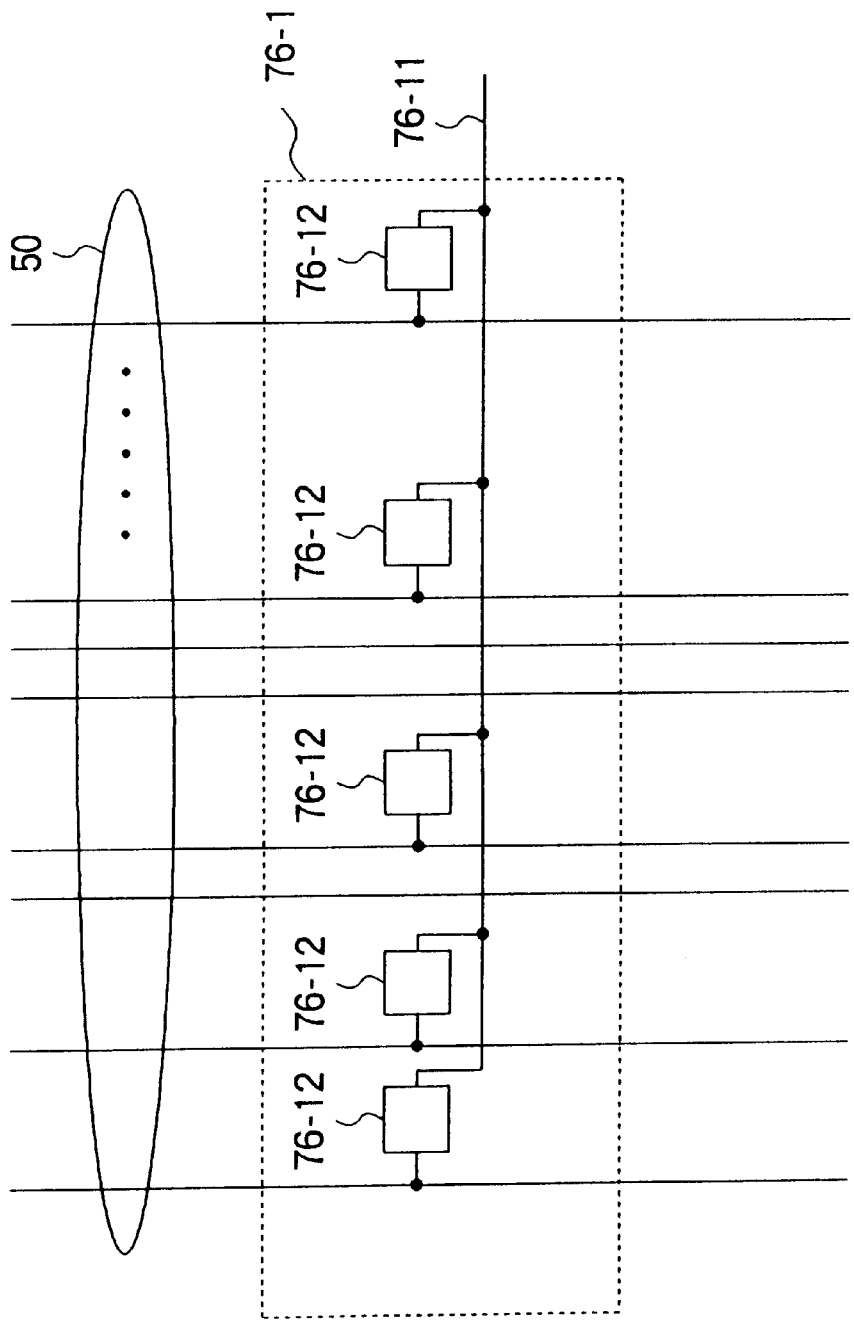
FIG. 21 is a circuit diagram showing an example of an output unit illustrated in FIG. 20.

FIG. 21 shows a typical example of the output unit 76-1. This applies to the output unit 76-2. The output unit 76-1 has one input line 76-11. The input line 76-11 is connected to one or more lines of the group of interconnection lines 50 through a programmable switch 76-12. The programmable switch 76-12 is a circuit to connect or disconnect two terminals in accordance with a program. This programmable switch is similar to the programmable switch 42 illustrated in FIGS. 12 through 14. With the programmable switch 42 in FIG. 14, the input terminal 42-3 is connected to the input line 76-11 and the output terminal 42-4 is connected to one line of the group of interconnection lines 50. In the output units 76-1 and 76-2, it is not necessary to connect the same line to the output unit out of the group of interconnection lines 50.

Figure 22:
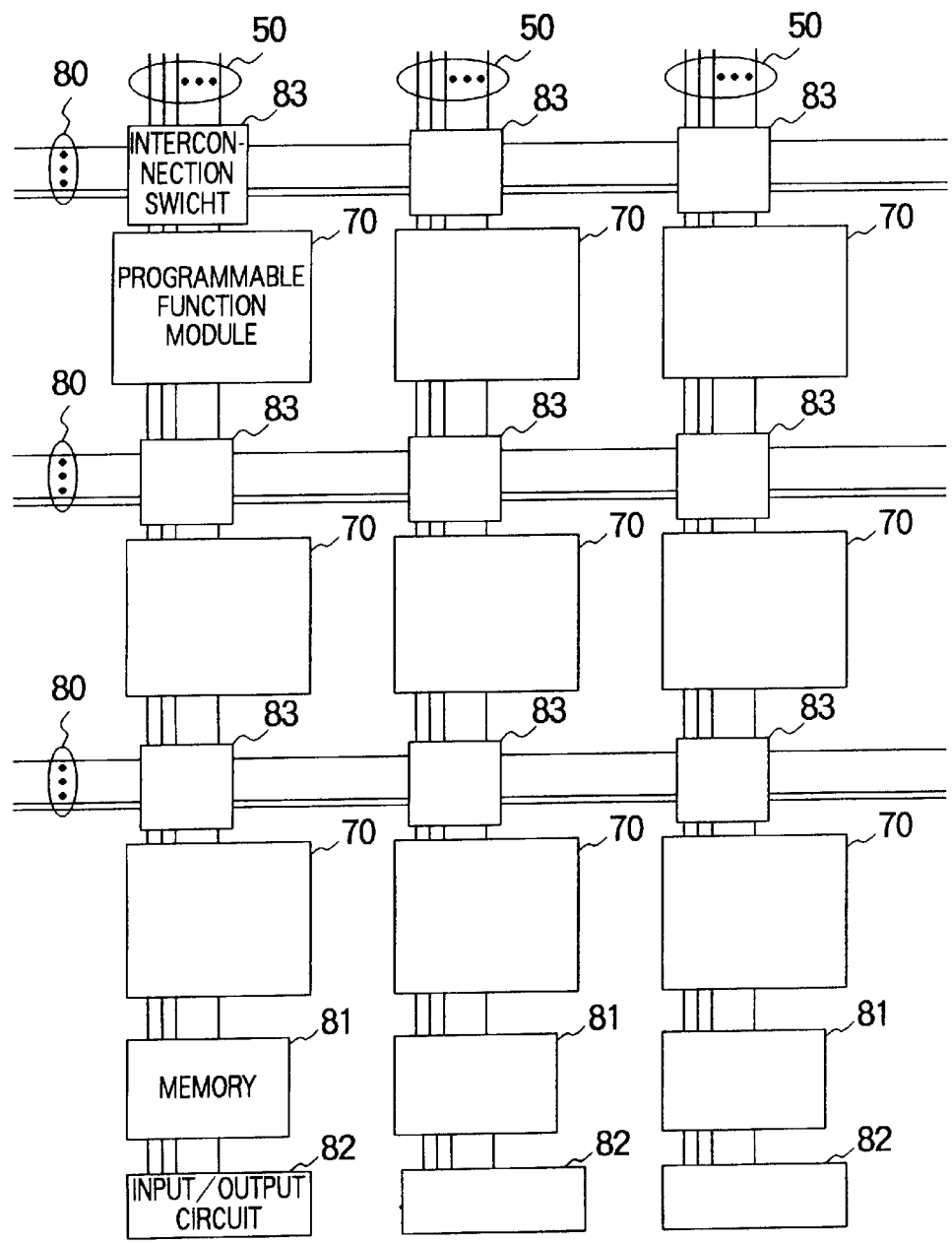
FIG. 22 is a diagram showing an example of a programmable logic device to which the present invention is applied.

FIG. 22 shows a typical example of a programmable logic device in which the above-mentioned programmable function modules 70 are arranged in a two dimensional array on a semiconductor integrated circuit. The interconnection lines 50 that extend vertically in FIG. 22 interconnect the programmable function modules 70 aligned in the vertical direction. Interconnection lines 80 that extend horizontally interconnect the interconnection lines 50 to each other. The interconnection lines are also connected to other various circuit such as a memory 81 and an input/output circuit 82 that serves as an interface to outside circuits, on the same semiconductor integrated circuit. The vertical and horizontal interconnection lines 50 and 80 are for signal transmission among the inputs and the outputs of various circuits including the programmable function modules 70, the memories 81, and the input/output circuits 82, that are all mounted on the semiconductor integrated circuit. In FIG. 22, an interconnection switch 83 is placed at the junction between the interconnection lines 50 extending in the vertical direction and the interconnection lines 80 extending in the horizontal direction. The interconnection switches 83 can set the connections and the disconnections of the lines in accordance with a program.

Figure 23:
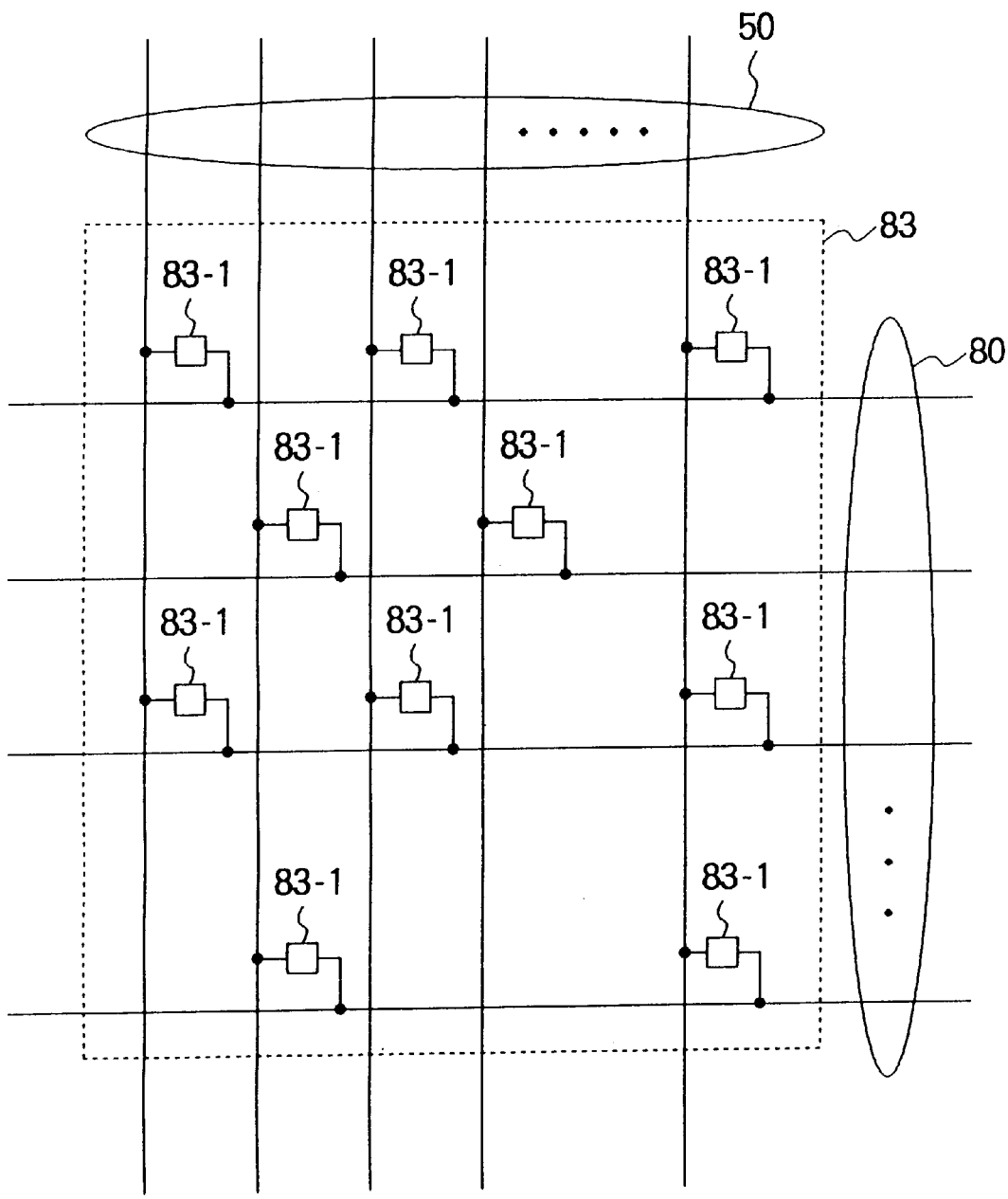
FIG. 23 is a diagram showing an example of configuration of an interconnection switch illustrated in FIG. 22.
Figure 24:
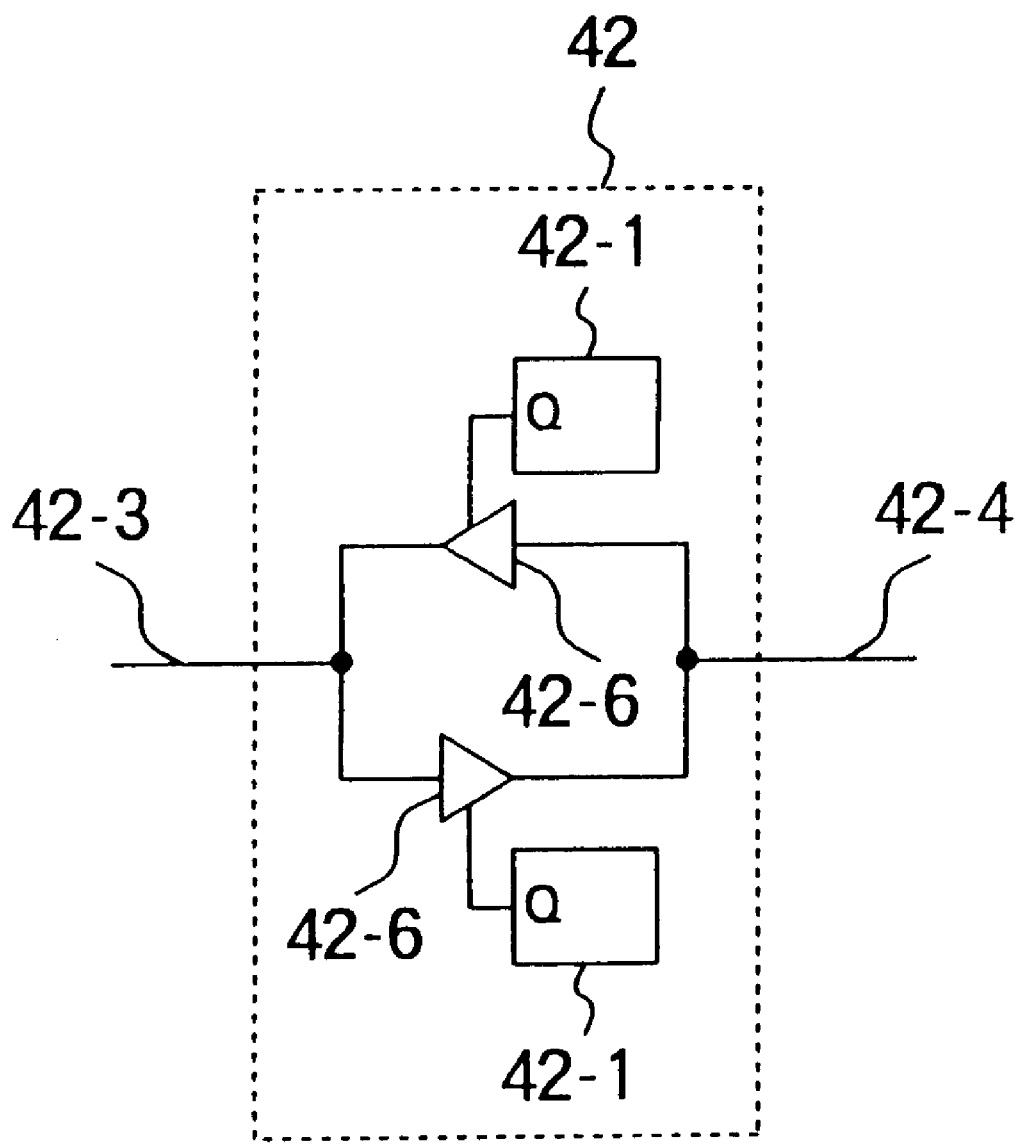
FIG. 24 is a circuit diagram showing an example of a programmable switch in the interconnection switch illustrated in FIG. 22.

Referring to FIG. 23, a typical example of the interconnection switch 83 is described. Programmable switches 83-1 are properly placed at the junction between the interconnection lines 50 and 80. The connections and disconnections of the interconnection lines extending vertically and horizontally are determined by means of setting the connection/disconnection state of the programmable switches 83-1 by using a program. The programmable switch 83-1 may be the programmable switch 42 described in conjunction with FIGS. 12 through 14. However, the programmable switch 83-1 used for this purpose may be required to have a signal generation function, that is, a buffering function. On the other hand, the programmable switch 42 described in conjunction with FIGS. 12 and 13 has no buffering function. In addition, the programmable switch 83-1 used for this purpose may be required to allow bi-directional communication of a signal. However, the programmable switch 42 in FIG. 14 can transmits a signal only in one direction. In this case, as shown in FIG. 24, the programmable switch 42 having two tristate buffers 42-6 connected in the opposite direction is used. This programmable switch 42 has both the bi-directional communication function between the input terminal 42-3 and the output terminal 42-4 and the buffering function.

The programmable logic device, the interconnection lines, and the interconnection switches illustrated and described above are merely examples of possible modifications thereof. The present invention is not limited to those specific examples. In particular, the group of interconnection lines may be any one that connects the input of the one or more programmable function module or other circuits to the output on the same semiconductor integrated circuit.

In the first embodiment of the present invention, the full adder 31 is used to provide a programmable function block that can perform high speed arithmetic operation such as addition or multiplying operation. Furthermore, a plenty of logic functions can be provided with the combination of the full adder 31 with the preposition logic 32 that functions as the various logic circuits.

Next, a second embodiment of the present invention is described. The second embodiment of the present invention comprises a plurality of programmable function blocks 20' arranged in a manner illustrated in FIG. 25. The programmable function block 20' comprises an input block 22' having input switch units 40-1 through 40-4, and a logic block 21' having a full adder 31 and a preposition logic 32.

Figure 25:
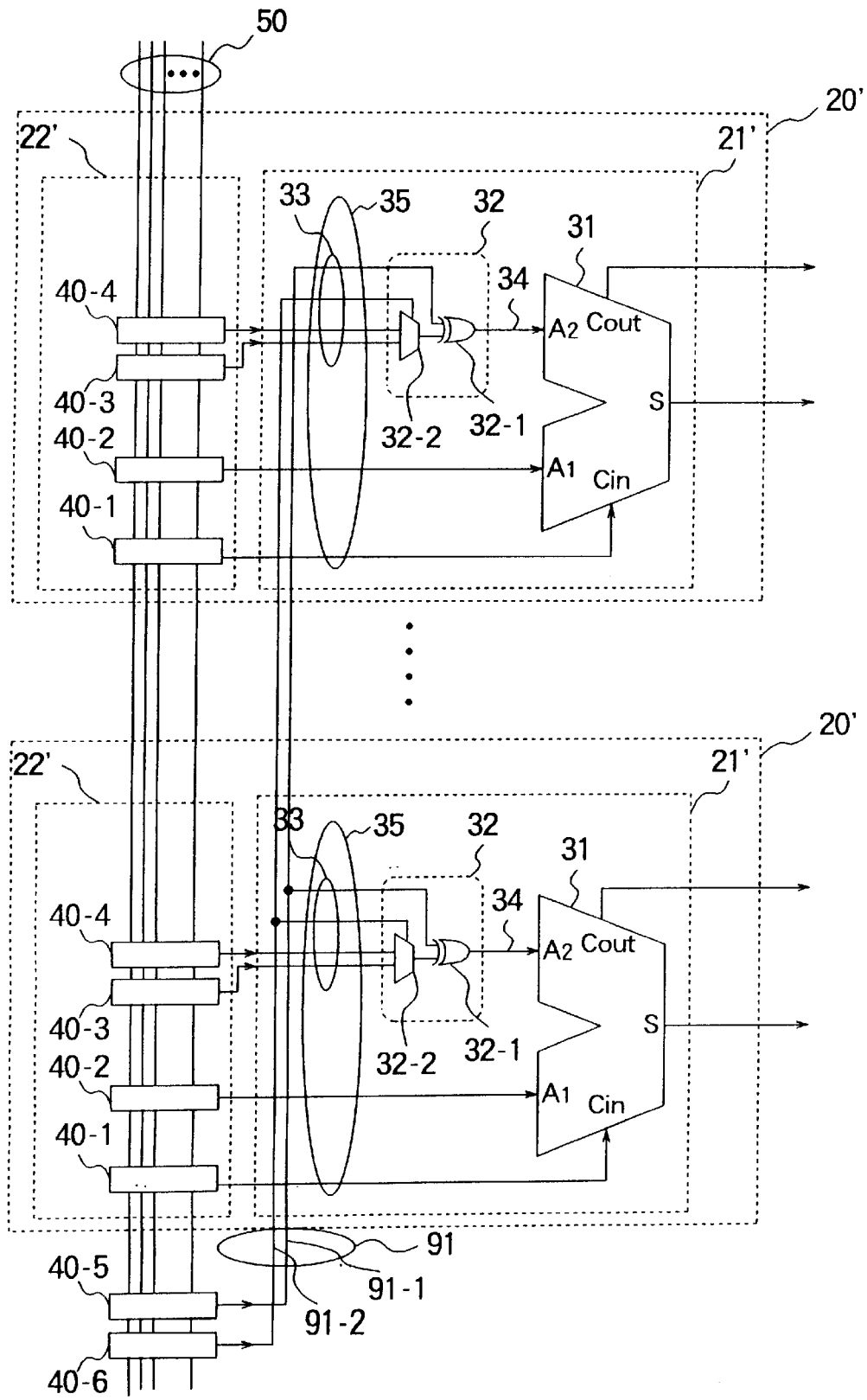
FIG. 25 is a block diagram showing configuration of a second embodiment of the present invention.

One or more of the inputs 33 of the preposition logic 32 in the programmable function block 20' are connected to a group of signal lines 91 common to the plurality of programmable function blocks 20'. In FIG. 25, the programmable function blocks 20' having one preposition logic 32 are aligned and two of the inputs of the preposition logic 32 are connected via the common group of signal lines 91. Thus, the group of signal lines 91 in this case comprises common signal lines 91-1 and 91-2. The common signal lines 91-1 and 91-2 are connected to the group of interconnection lines 50 through the input switch unit 40-5 and 40-6, respectively.

Any inputs 33 of the preposition logic 32 may be commonly used but one of or both the inputs I2 or I3 in FIG. 3 commonly used are particularly useful for the applications to computer technologies. In FIG. 25, both the inputs I2 and I3 are commonly used. Examples of an operator frequently used in computers are described below.

Figure 26:
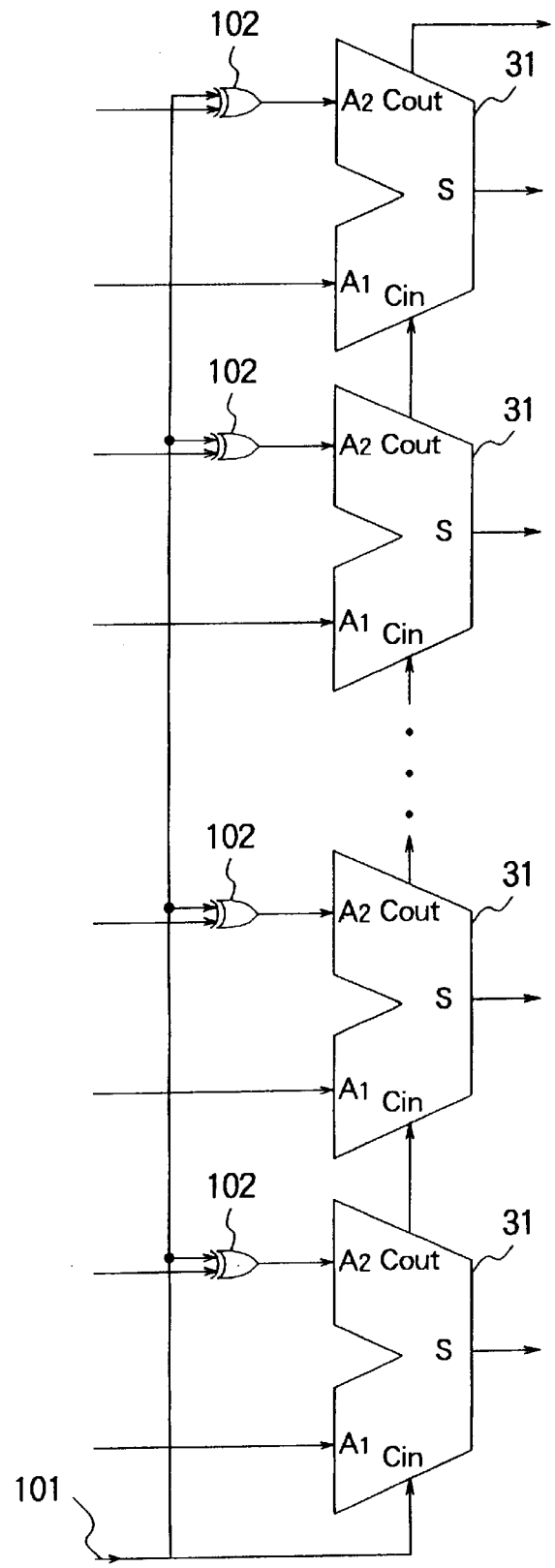
FIG. 26 is a diagram showing configuration of a multi-bit adder/subtracter to be implemented by the circuit illustrated in FIG. 25.

Referring to FIG. 26, an example of a multi-bit adder/subtracter is described. The adder/subtracter functions as an adder when a multi-bit common input 101 is "0" (LOW logic level) and functions as a subtracter when the multi-bit common input 101 is "1" (HIGH logic level). The adder/subtracter can be realized with the circuit shown in FIG. 25. In this event, the multi-bit common input 101 in FIG. 26 corresponds to the common signal line 91-1 in FIG. 25. In addition, an EXOR 102 is realized by the preposition logic 32 as shown in FIG. 4.

Figure 27:
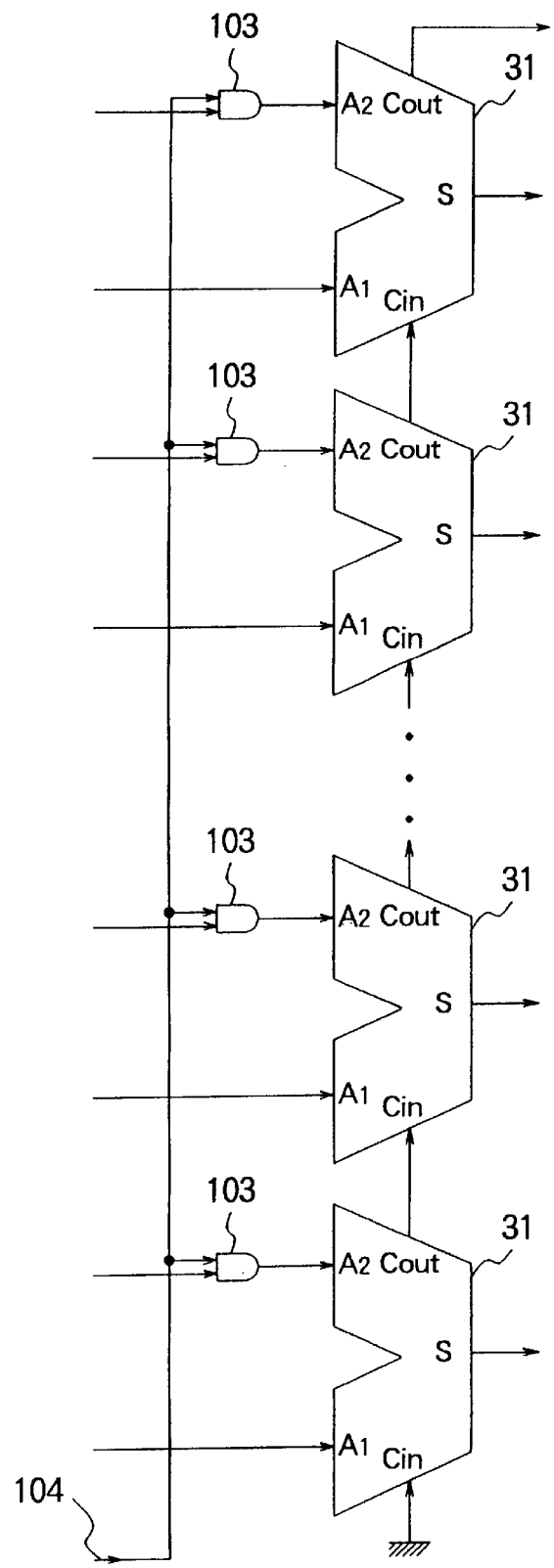
FIG. 27 is a diagram showing a multi-bit arithmetic circuit that is an element of a multiplier to be implemented by the circuit illustrated in FIG. 25.

Referring to FIG. 27, an example of a multi-bit arithmetic circuit that is an element of a multiplier. In this multi-bit arithmetic circuit, an AND circuit 103 associated with the input of the full adder is realized by the preposition logic 32 and is used for calculating a partial product of the multiplying operation. This multi-bit arithmetic circuit can be realized with the circuit shown in FIG. 25. In this case, a multi-bit common input 104 in FIG. 27 corresponds to the common signal line 91-2 in FIG. 25.

Figure 28:
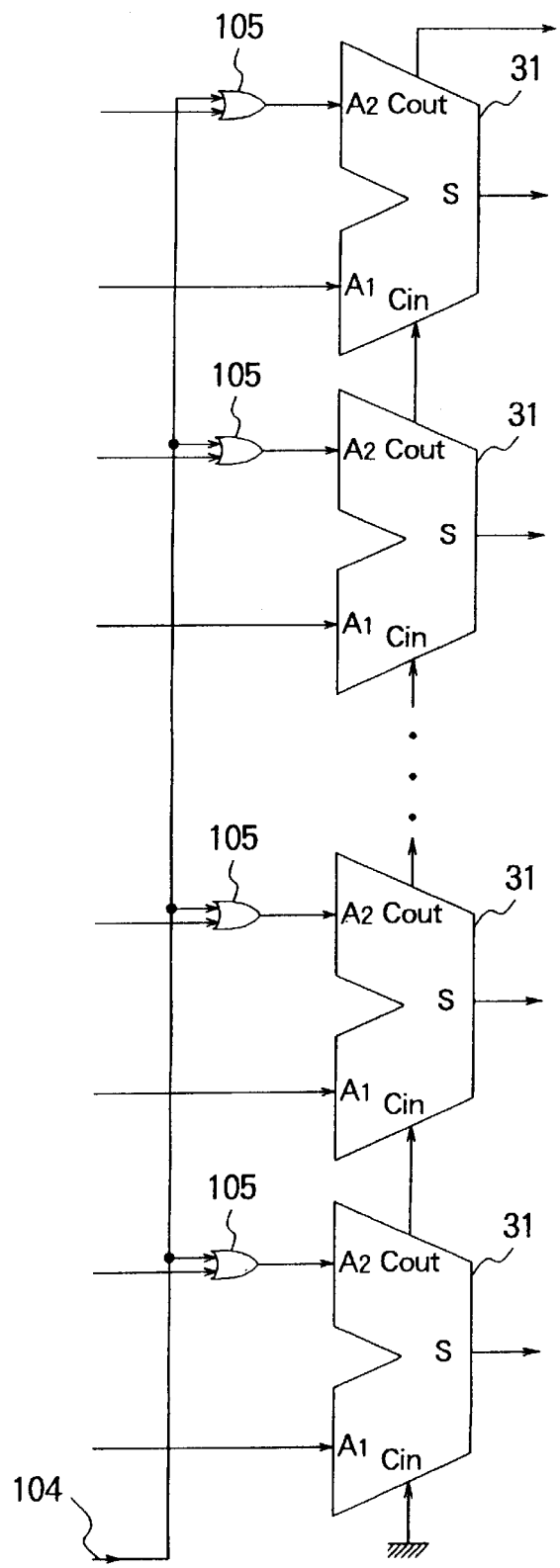
FIG. 28 is a diagram showing a multi-bit adder with an overflow processing function to be implemented by the circuit illustrated in FIG. 25.

Referring to FIG. 28, an example of a multi-bit adder having an overflow processing function. This multi-bit adder performs normal addition operation when the multi-bit common input 104 is "0". When the multi-bit common input 104 is "1", then an OR circuit 105 associated with the full adder 31 performs overflowing processing, that is, all bits on the argument input A2 are set to "1". This multi-bit adder can be realized with the circuit in FIG. 25. In this event, the multi-bit common input 104 in FIG. 28 corresponds to the common signal line 91-2 in FIG. 25. The OR circuit 105 is realized by the preposition logic 32.

Figure 29:
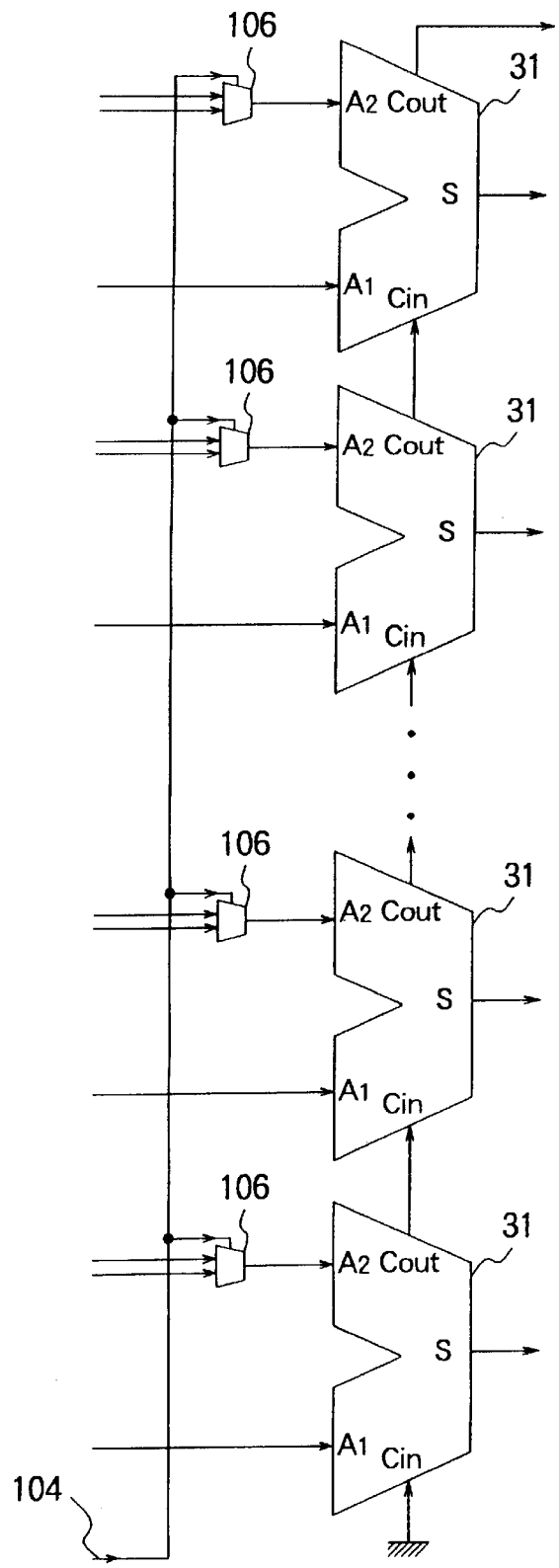
FIG. 29 is a multi-bit adder of which input changes depending on conditions.

Referring to FIG. 29, a multi-bit adder of which input changes depending on conditions. One of the two inputs of an MUX 106 associated with the full adder 31 is selected depending on the value of the multi-bit common input 104. The selected input is used as the argument input A2 of the full adder 31. This multi-bit adder can be realized with the circuit shown in FIG. 25. The MUX 106 is realized by the preposition logic 32.

The second embodiment of the present invention has the advantage over the first embodiment in the smaller area occupied for the programmable function blocks. A part of inputs of the programmable function blocks are shared by a plurality of programmable function blocks to reduce the number of input switch units that require a larger area.

As described above, the present invention provides the following effects. The first effect lies in the function to provide fast arithmetic operation. This is achieved with the full adder used in the logic block. The second effect lies in the plenty of logic functions obtained by means of combining the full adder with the preposition logic that functions as various different logic circuits. The third effect lies in the programmable function blocks that occupies a smaller area. This is because a part of inputs of the programmable function block are shared by a plurality of programmable function blocks.

What is claimed is:

1. A programmable function block comprising a logic block including a full adder with three input terminals and at least one preposition logic, and one or more programmable input switch unit for use in selectively switching a HIGH logic level signal, a LOW logic level signal, and a signal on interconnection lines that run throughout a semiconductor integrated circuit having at least one logic block mounted thereon and available to connect between inputs and outputs of a plurality of circuits mounted on the semiconductor integrated circuit, wherein said preposition logic comprises a first multiplexer that selects one of a first input and a second input depending on the value of a control input to produce the selected input, and an exclusive OR circuit for performing an exclusive OR operation on two inputs including said selected input from said first multiplexer, an output of said preposition logic being connected to one of the three input terminals of said full adder and each output of said programmable input switch units being connected to each input of said logic block.

2. A programmable function block as claimed in claim 1, wherein said exclusive OR circuit comprises an inverter of which input is one of said two inputs and a second multiplexer, said second multiplexer being adapted to receive one of said two inputs as one input and the output of said inverter as the other input to select one of these two inputs depending on the value of said one control input to produce the selected input, each of said first multiplexer and said second multiplexer having an NMOS transistor and a PMOS transistor, the sources of said NMOS transistor and said PMOS transistor being supplied with each of said two inputs, the drains of said NMOS transistor and said PMOS transistor being connected to each other to produce said selected input from a junction therebetween, and the gate of said NMOS transistor and said PMOS transistor being connected to each other to receive said one control input at a junction therebetween.

3. A programmable function block as claimed in claim 1, wherein said programmable input switch unit comprises an output signal line, one or more programmable switches for use in connecting one or more lines of said interconnection lines and said output signal line, and a signal supply circuit that is connected to said output signal line to set the output state to a HIGH logic level state, a LOW logic level state, or a high impedance state in accordance with a program.

4. A programmable function block as claimed in claim 3, wherein said signal supply circuit comprises first and second single-bit memories, an NMOS transistor, and a PMOS transistor, the source of said NMOS transistor being grounded, the gate of said NMOS transistor being connected to an output of said first single-bit memory, the source of said PMOS transistor being connected to a power supply, and the gate of said PMOS transistor being connected to an output of said second single-bit memory, the drain of said NMOS transistor being connected to the drain of said PMOS transistor to produce a HIGH logic level signal or a LOW logic level signal from a junction therebetween.

5. A programmable function block as claimed in claim 1, wherein said programmable input switch unit comprises a multiplexer with a plurality of inputs and a plurality of control inputs, said plurality of inputs being connected to one or more lines of said interconnection lines and an output of said single-bit memory that is capable of producing a HIGH logic level signal or a LOW logic level signal by using a program, said plurality of control inputs being connected to a plurality of single-bit memories, said multiplexer being adapted to produce one of said plurality of inputs depending on the content set to said single-bit memories.

6. A programmable function block as claimed in claim 1, wherein said programmable input switch unit comprises a multiplexer with a plurality of inputs and a plurality of control inputs, said plurality of inputs being connected to one or more lines of said interconnection lines, a power supply, and the ground, said plurality of control inputs being connected to a plurality of single-bit memories, said multiplexer being adapted to produce one of said plurality of inputs depending on the content set to said single-bit memories.

7. A programmable function block as claimed in claim 1, further comprising a signal supply circuit for supplying a HIGH logic level signal and a LOW logic level signal to said programmable input switch unit, said signal supply circuit comprising a first circuit capable of selecting one of the HIGH logic level signal and the high impedance state in accordance with a program to supply the selected signal to at least one of said interconnection lines, and a second circuit capable of selecting one of the LOW logic level signal and the high impedance state in accordance with a program to supply the selected signal to at least one of said interconnection lines.

8. A programmable function block as claimed in claim 7, wherein said first circuit comprises a first single-bit memory and a PMOS transistor, said PMOS transistor having the source connected to a power supply, the gate connected to said first single-bit memory, and the drain used as an output, and wherein said second circuit comprises a second single-bit memory and an NMOS transistor, said NMOS transistor having the source which is grounded, the gate connected to said second single-bit memory, and the drain used as an output.

9. A programmable function block as claimed in claim 1, wherein at least one input of said preposition logic is connected by common lines to the corresponding input of the preposition logic in a different programmable function block, each of the common lines being connected to each of outputs of one or more programmable input switch units.

10. A programmable function block as claimed in claim 9, wherein the at least one input of said preposition logic that is connected to the common lines is at least one of the control input of said first multiplexer and one input of the two inputs of said exclusive OR circuit, said one input being different from the output of said first multiplexer.

* * * * *